United States Patent [19]

Powell

[11] Patent Number: 4,628,256
[45] Date of Patent: Dec. 9, 1986

[54] THERMOCOUPLE POWER METER

[75] Inventor: Robert Powell, Gaithersburg, Md.

[73] Assignee: Weinschel Engineering Co., Inc., Gaithersburg, Md.

[21] Appl. No.: 508,090

[22] Filed: Jun. 27, 1983

[51] Int. Cl.⁴ .................... G01R 21/04; G01R 19/24; G01R 19/18
[52] U.S. Cl. ..................... 324/95; 324/106; 324/118; 330/10
[58] Field of Search ............ 324/95, 106, 118; 330/10; 374/179, 182

[56] References Cited

U.S. PATENT DOCUMENTS

| | | |
|---|---|---|
| 2,510,930 | 6/1950 | MacLeish . |
| 2,933,691 | 4/1960 | Stair ................................ 330/10 |
| 2,939,080 | 5/1960 | Hurwitz ............................. 330/10 |
| 2,980,861 | 4/1961 | Popowsky ......................... 330/10 |
| 3,148,335 | 9/1964 | Young ............................... 330/10 |
| 3,424,981 | 1/1969 | Erdman . |
| 3,430,125 | 2/1969 | Povenmire et al. ............... 330/10 |
| 3,535,637 | 10/1970 | Goransson . |
| 3,541,320 | 11/1970 | Beall . |
| 3,555,298 | 1/1971 | Neelands . |
| 3,577,074 | 5/1971 | Praglin . |
| 3,667,041 | 5/1972 | Senour . |
| 3,735,274 | 5/1973 | Nelson ............................... 330/10 |
| 3,781,869 | 12/1973 | Sudnick et al. . |
| 3,818,336 | 6/1974 | Marshall ............................ 324/118 |
| 3,893,103 | 7/1975 | Prill . |

OTHER PUBLICATIONS 4 pages of discussion Hewlett-Packard thermocouple power meters.

Primary Examiner—Ernest F. Karlsen
Attorney, Agent, or Firm—Hall, Myers & Rose

[57] ABSTRACT

An improved meter for measuring RF power. The RF power is applied to thermocouple means which transforms the RF power into a low level d.c. signal which then passes through a chopper stage that is driven by a clamped sinusoidal input. The output of the chopper stage includes periodic pulses with a prescribed pulse spacing: pulse duration ratio, the pulses being passed through a band-pass filter at a harmonic of the chopper drive signal. The filtered signal, which is also amplified, undergoes synchronous detection with a tri-level square-wave signal which is centered in phase relative to the amplified, filtered signal when the two signals are in phase. The power meter measurements adjusted for zero drift and calibration drift by a microprocessor; based on zero measurements and calibration measurements made before and after an RF measurement is made. Measurements are stored and processed digitally to enhance accuracy. Signals through the meter can be at relatively high frequencies to reduce 1/f noise; spiking at the chopper stage and synchronous detector is virtually eliminated; and the tri-level square-wave permits greater tolerance to phase shift, all of which reduce output error.

30 Claims, 5 Drawing Figures

SIGNAL ON LINE 134
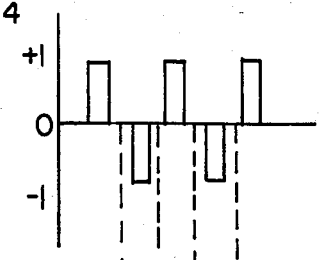
SIGNAL ON LINE 133
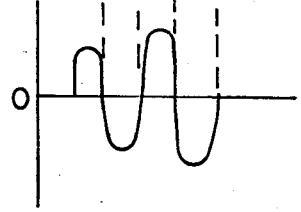
SYNC DETECTOR OUTPUT ON LINE 136
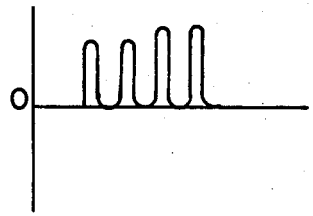
FIG. 2
(a) 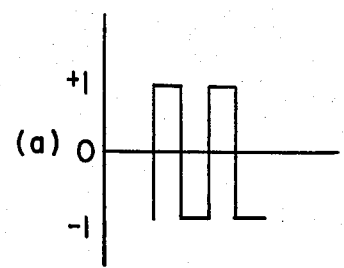
(b) 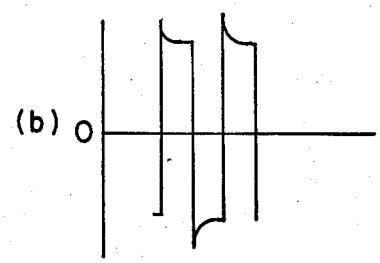
FIG. 3 PRIOR ART
FIG. 5

THERMOCOUPLE POWER METER

TECHNOLOGICAL CONTEXT OF THE INVENTION

Thermocouple power meters are well known in the art of measuring RF power. Specifically, it is known that RF power applied to a thermocouple element will result in a very low-level (e.g. 160 nanovolt for 1 mw of applied RF power) d.c. signal. Due to its low level, the d.c. signal output of the thermocouple element is normally chopped to facilitate processing. Specifically, the very low d.c. signal is formed into a square wave by a square wave drive signal to the chopper and amplified, the high-level squared and amplified a.c. signal then being synchronously detected.

The chopping fequency is relatively low at 220 Hz. Although high frequency has been recognized as desirable to reduce 1/f noise, prior thermocouple power meters have been limited to relatively low frequencies because spiking caused by the chopping inevitably gets included in the signal chopped. These spikes are at just the right frequency to be integrated by a synchronous detector and are considered to be valid signal. By lowering the frequency, this "masquerading" signal of spikes is made smaller. Prior systems suggest that zero setting be employed to avoid the adverse effects of spiking, however at the expense of using up dynamic range in amplifiers in the meter. Hence, due to the spiking, there is greater 1/f noise, loss of dynamic range, and enhanced possibility of output error.

In addressing the problem of reducing noise while amplifying the small signals, prior meters have featured limited amplifier bandwidth. The smaller the signal, that is, the smaller the bandwidth. This answer has not proved totally satisfactory however.

Another recognized problem of prior thermocouple power meters is that measurements have been open-loop. If drift or other inaccuracies occur, the meter will not realize it. Noting that with thermocouples, there is no direct substitution as in thermistor power meters, prior commentators have pointed to variations in d.c. generated by the thermocouple for a given RF input thereto, where sensor sensitivity changes and drift occur. Because there is no feedback to correct the condition, measurement errors can occur without compensation therefor.

In an attempt to close the loop, the prior art suggests the periodic applying of a fixed RF signal to the thermocouple to perform a calibration. While addressing the problem, this technique is limited in accuracy where RF input is good to only several parts in a hundred. Moreover, the technique is manual, being achieved by turning a screwdriver adjustment to produce the fixed RF input.

SUMMARY OF THE INVENTION

In facing the recognized concerns of the past, the present invention avoids spiking by driving a chopper stage—which chops a d.c. signal from a thermocouple pair—with a sinusoidal rather than a square-wave input. In that way, the chopper passes rounded-top outputs rather than square-wave outputs that have attendant spikes. Moreover, spiking is further minimized by decreasing the amplitude of the chopper signal significantly.

By eliminating the chopper spiking, the frequency of the chopper drive and hence the chopper output can be increased without generating the "masquerading" signal. At the same time, 1/f noise is reduced.

To further enhance operation, a harmonic (rather than the fundamental) of the signal passing through the chopper stage is processed. In addition to reducing spiking, this feature reduces the effect of chopper drive leak-through being improperly processed as valid signal. Specifically, a band-pass filter at the frequency of the prescribed harmonic is interposed between the chopper stage and a synchronous detector.

As in the prior devices, synchronous detection is performed. However, (a) the inputs are at the harmonic frequency, (b) the signal to be measured is without spiking effects, and (c) the detection signal is a tri-level, square wave centered on the input signal when the two inputs are in-phase. Prior devices employ a two-level square wave detection signal to be matched with a spiked square-wave input signal of similar pulse duration and period. With the prior devices, a slight phase shift results in a negative product output from the synchronous detector and a large error output. The present invention avoids this by permitting the tri-level square-wave and the signal to vary in relative phase without producing serious degradation in the generated product.

In overcoming the open-loop criticism, the present invention includes a microprocessor which is used to zero and calibrate the meter automatically. According to the zero offset feature, a digital value is generated that corresponds to the uniform offset of signals to be measured. In the past, a zero offset was stored in a capacitor across which a high impedance was placed. The prior technique, especially over time, results in degraded offset accuracy. The digital zero offset generated and stored on command is easier to obtain and uniform over time, thus providing a significant improvement over the prior art.

Also, the microprocessor effectuates calibration not based solely on the RF input, but also employs a d.c. substitution signal derived by the microprocessor. That is, the microprocessor determines a d.c. substitution signal that provides the same digital output reading as a corresponding known RF input. Rather than reapplying the known RF input to the thermocouple to see if the same digital output results as in the prior art, the present invention reapplies the corresponding d.c. substitution signal to the chopper stage. This difference is most significant when it is noted that the accuracy of the RF input is on the order of one part in a hundred while the accuracy of the d.c. substitution signal is on the order of one part in $10^6$. Greater calibration accuracy of the circuitry following the thermocouple is thus an object of the invention.

The microprocessor also determines an adjustment factor K which is used in determining true RF power that is, a power measurement that accounts for zero drift and calibration drift. K is determined from a power measurement (P) and (a) two zero measurements, one before (z1) and one after (z2) the power measurement and (b) two calibration measurements, one before (c1) and one after (c2) the power measurement. By first defining a functional QUOTIENT to be:

$$\text{QUOTIENT} = \frac{P - (z1 + z2)/2}{\frac{(c1 + c2) - (z1 + z2)}{2}}$$

the true RF power is defined as:

$$RF_{TRUE} = QUOTIENT/K$$

With a known RF input, a value for K is determined. With a determined K, the $RF_{TRUE}$ for an unknown RF input to the thermocouple can be derived from the $RF_{TRUE}$ equation.

Also, by commanding the application of different d.c. signals to the chopper stage input, various K factors for differing RF input amplitudes can be derived.

BRIEF DESCRIPTION OF THE DRAWINGS

FIG. 2 is an illustration showing two signals which, by synchronous detection, form a product output in accordance with the invention.

FIG. 3 is an illustration showing two signals which, by synchronous detection, form a product output in accordance with a prior art arrangement.

FIG. 5 is a graph of power measurements over time.

DESCRIPTION OF THE INVENTION

Figure 1:
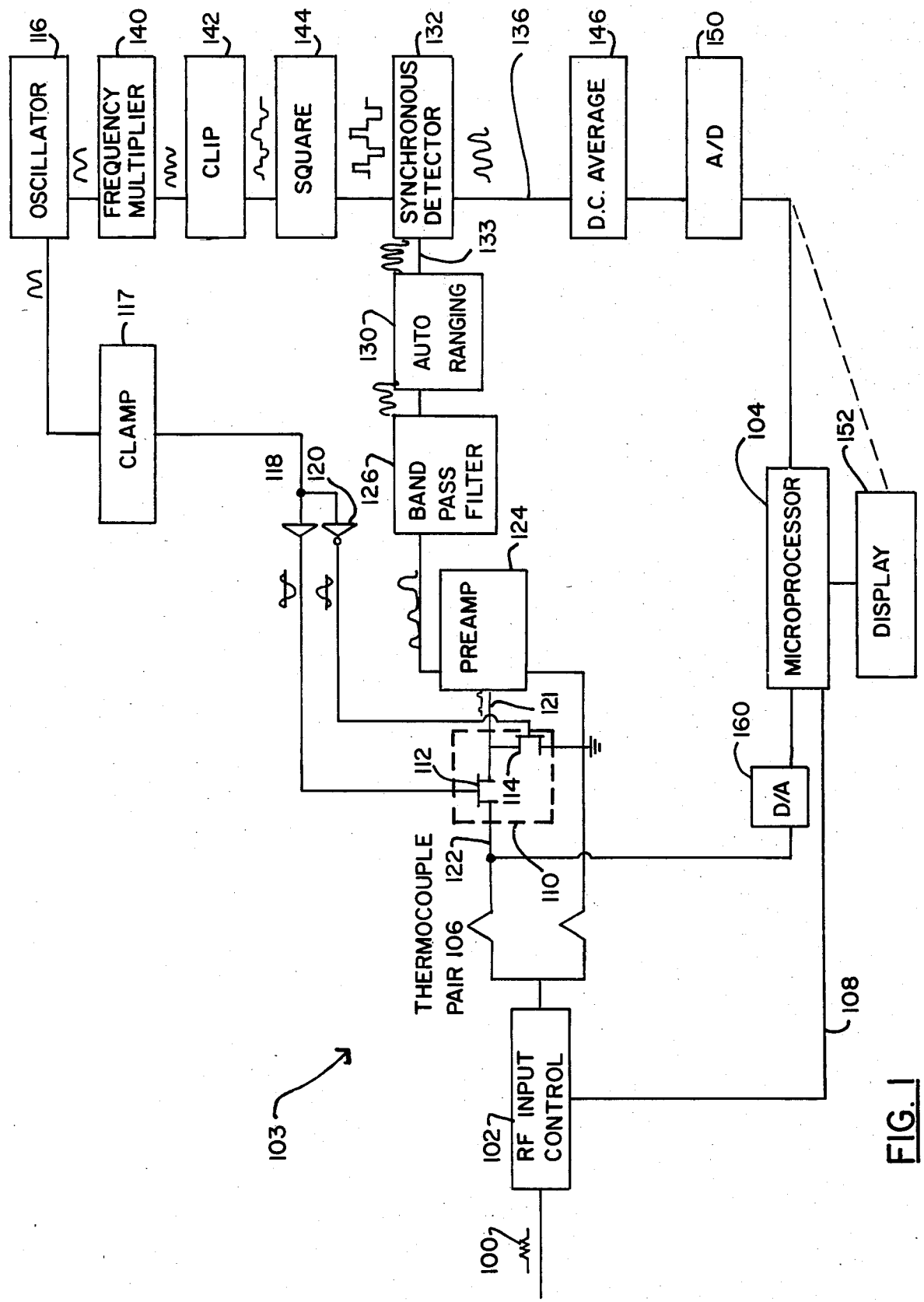
FIG. 1 is an illustration depicting the major elements of the invention.

In FIG. 1, an RF input 100 is shown entering an RF input control element 102 of a thermocouple power meter 103. Also entering the RF input control element 102 is an input line from a microprocessor 104. The RF input control element 102 selectively permits any one of several RF inputs to be applied to a thermocouple pair 106—including the RF input 100 and a zero input or a reference input such as one milliwatt selected by the microprocessor 104 via line 108.

The thermocouple pair 106 converts the RF input, if any, exitting the control element 102 into heat and thereafter into a d.c. signal in conventional fashion. The amplitude of the d.c. signal generated by the thermocouple pair 106 is low and difficult to measure with accuracy. Accordingly, the d.c. signal from the thermocouple pair 106 is passed through a chopper stage 110 that includes a series chopper 112 and a shunt chopper 114. The series chopper 112 and the shunt chopper 114 are driven to operate complementarily, one being ON (or conductive) when the other is OFF (or non-conductive). For simplification, capacitors and resistors and the like that would be included in a detailed circuit diagram are omitted, such elements being within the knowledge of one of ordinary skill in the art to include.

The signals that drive the choppers 112 and 114 are derived from an oscillator 116. The oscillator 116 generates a sinusoidal wave output at a basic frequency, the sinusoidal wave output being symmetrical about a reference, e.g. zero, level. The sinusoidal wave output is offset with respect to the reference level by a clamp 117 and is then directed (a) to the "gate" of the chopper 112 via an amplifier 118 and (b) to the "gate" of the chopper 114 via an amplifier-inverter 120. As seen in FIG. 1, the drive signals to the choppers 112 and 114 achieve the complementary operation.

Because the chopper stage 110 is driven by a sinsoidal input, there is no spiking in the chopper output. Moreover, the oscillator 116 can provide a drive signal at a relatively high frequency, for example 1000 Hz, compared with prior systems that were limited to operation at frequencies below 300 Hz. Using the sinusoidal input as the drive signal of the chopper stage 110 thereby reduces the 1/f noise because the frequency can be made larger without the spiking that was found in prior systems.

The output from the chopper stage 110 on line 121 is a signal comprised of a series of single-polarity (e.g. positive), sinusoidally-shaped pulses which are at the frequency of the chopper drive and have an amplitude that corresponds to the level of d.c. signal received by the chopper stage 110 along line 122. As the d.c. signal on line 122 varies in amplitude corresponding variations in the chopper stage output on line 121 result. The signal on line 121 is amplified by a pre-amplifier circuit 124, the amplified signal from the circuit 124 entering a band-pass filter 126.

At this point, it is noted that the ratio of (a) spacing between pulses exitting the chopper stage 110 and (b) the duration of the pulses exitting the chopper stage 110 is defined to correspond to the frequency at which the band-pass filter 126 is tuned. The band-pass filter 126 is tuned to a harmonic frequency of the oscillator 116, or more specifically, the frequency of the drive signal to each chopper 112 and 114. A specific spacing: duration ratio of pulses entering the band-pass filter 126 corresponds to the harmonic frequency, as is known. Specifically, the relationship of $$ratio = 2h - 1$$

(for harmonics $h \geq 2$) indicates that the second harmonic is associated with the ratio of three, the third harmonic is associated with the ratio of five, and so forth. The output of the band-pass filter 126 is a sinusoidal signal at the predetermined harmonic at which the band-pass filter 126 is tuned. The output of the band-pass filter 126 varies in amplitude with the amplitude of the input pulses thereto.

Processing a signal at a harmonic rather than at the basic, or fundamental, frequency of the drive signal achieves a significant benefit. Specifically, the band-pass filter 126 will filter out that portion of the drive signal that might leak through the chopper stage 110 and thereby reduce the effects of such leak-through. In addition, the band-pass filter 126 will screen out other undesired noise generated at frequencies outside the band.

Following the band-pass filter 126 is an autoranging circuit 130 which introduces gain to the signal as desired. The autoranging circuit 130 includes a plurality of decade gain change stages. In FIG. 1, all the stages of the circuit 130 follow the filter 126. However, it is noted that one or more of the stages may precede the filter 126 as desired.

A synchronous detector 132 is provided to receive the signal on line 133 after it passes through the autoranging circuit 130 and the filter 126.

Also entering the synchronous detector 132 on line 134 is a tri-level square-wave signal which periodically switches upward to a high level and downward to a low level, alteration, from a zero level. The high level is, preferably, +1 with the low level being −1. As seen in FIG. 1, the square-wave signal on line 134 remains at the value of +1 for a short interval, switches to the value of 0 for a short interval, switches to the value of −1 for a short interval, switches to the value of 0 for a short interval, and switches to the value of +1 for a short interval, the sequence repeating periodically.

The frequency of the square-wave signal on line 134 is the same as the signal on line 133, the square-wave signal on line 134 being centered in phase relative to the signal on line 133. That is, each +1 square pulse on line 134 is centered in time with respect to a corresponding positive half-cycle of the signal on line 133 and each −1 square pulse on line 134 is similarly centered with respect to a corresponding negative half-cycle of the signal on line 133.

As seen in FIG. 2, the synchronous detector 132 produces an output on line 136 that is the product of the signals on lines 133 and 134. Because it is formed of a sinusoid and a tri-level square wave in phase therewith, the product includes a series of positive pulses that have steep sides and rounded tops. Significantly, spiking is substantially prevented, thereby enhancing operation of the meter 103 (of FIG. 1) relative to known meters which were subject to spiking problems.

Referring again to FIG. 1, it is noted that the output on line 136 varies in amplitude with the signal on line 133. By tracing the various signals back through the elements of the meter 103, it is also noted that the output on line 136 varies in amplitude with the level of the d.c. signal entering the chopper stage 110 on line 122.

One embodiment for generating the desired square-wave on line 134 is illustrated in FIG. 1. Specifically, the signal generated by the oscillator 116 is multiplied by frequency multiplier 140, the multiplied output being clipped and squared by conventional elements 142 and 144, respectively. By selecting the desired frequency multiple with the multiplier 140, the frequency of the square-wave on line 134 can be set at a desired harmonic. This harmonic, as previously noted, is preferably the same as the harmonic frequency passed through the filter 126.

Referring again to FIG. 2, if the signal on line 133 is out-of-phase, the square-wave on line 134 is no longer centered with respect to the signal on line 133. However, the change in amplitude of the output on line 136 will experience only small variations as a result of the out-of-phase condition. Hence, phase changes due to elements in the power meter 103 will not seriously affect the output as in other meters.

FIG. 3 illustrates a prior art detector without the improvements of the present invention. Instead of a tri-level square-wave, the arrangement suggested by FIG. 3 has a two-level square-wave and instead of a sinusoidal input (on line 133) the FIG. 3 arrangement has a square-wave input with spikes thereon.

A slight phase shift of the input signal in FIG. 3(b), relative to the two-level square wave in FIG. 3(a), it is noted, results in a product which oscillates about the zero level. When the signals in FIGS. 3(a) and 3(b) are in precise synchrony, a positive d.c. value is generated, with periodic spikes being present. Shifting from synchrony, however, results in negative pulses in and introduces error to the product depicted in FIG. 3(c). The spikes in the product depicted in FIG. 3(c) also introduce error and detract from measurements made with the arrangement suggested by FIG. 4.

Hence, by not normally using the part of the signal on line 133 where the transition occurs, phase shoft error is reduced. In this regard, it is noted that the pulse width of each square-wave pulse is shown to be approximately T/2, one half the duration of the pulses in FIG. III(a). With T/2 width pulses, variations in phase of up to T/4 (i.e. 40°) can be experienced without serious phase error being introduced. The permissible variation in phase may be increased by decreasing the pulse width (to less than T/2) and increasing the time during which the signal is zero between pulses.

Returning to FIG. 1, a d.c. average stage 146 forms the output on line 136 into a d.c. analog signal. The d.c. analog signal is digitized in a conventional A/D converter 150. This digitized form of the (averaged) product may be displayed directly by display 152 or may be conveyed to the microprocessor 104. The A/D converter 150 has a selectable digital reference against which digitized values formed from analog (averaged) product signals are measured.

The microprocessor 104 translates the digitized value from the A/D converter 150 into a power measurement that can be indicated on the display 152.

In addition, the microprocessor 104 is used to zero and calibrate the meter 103 to further enhance measurement accuracy. The zeroing provides a value indicative of the drift, over time, in the zero level against which all measurements of RF are referenced. The calibration, on the other hand, reflects power measurment changes over time for a given fixed, d.c. signal applied to the input of the chopper stage 110. The zeroing and calibration permits the system to apply a connecting factor to a digitized value exitting the A/D converter 150, for a corresponding RF input, to provide a true RF power measurement although measurements of the power meter 103 may vary, or drift, over time.

Figure 4A:
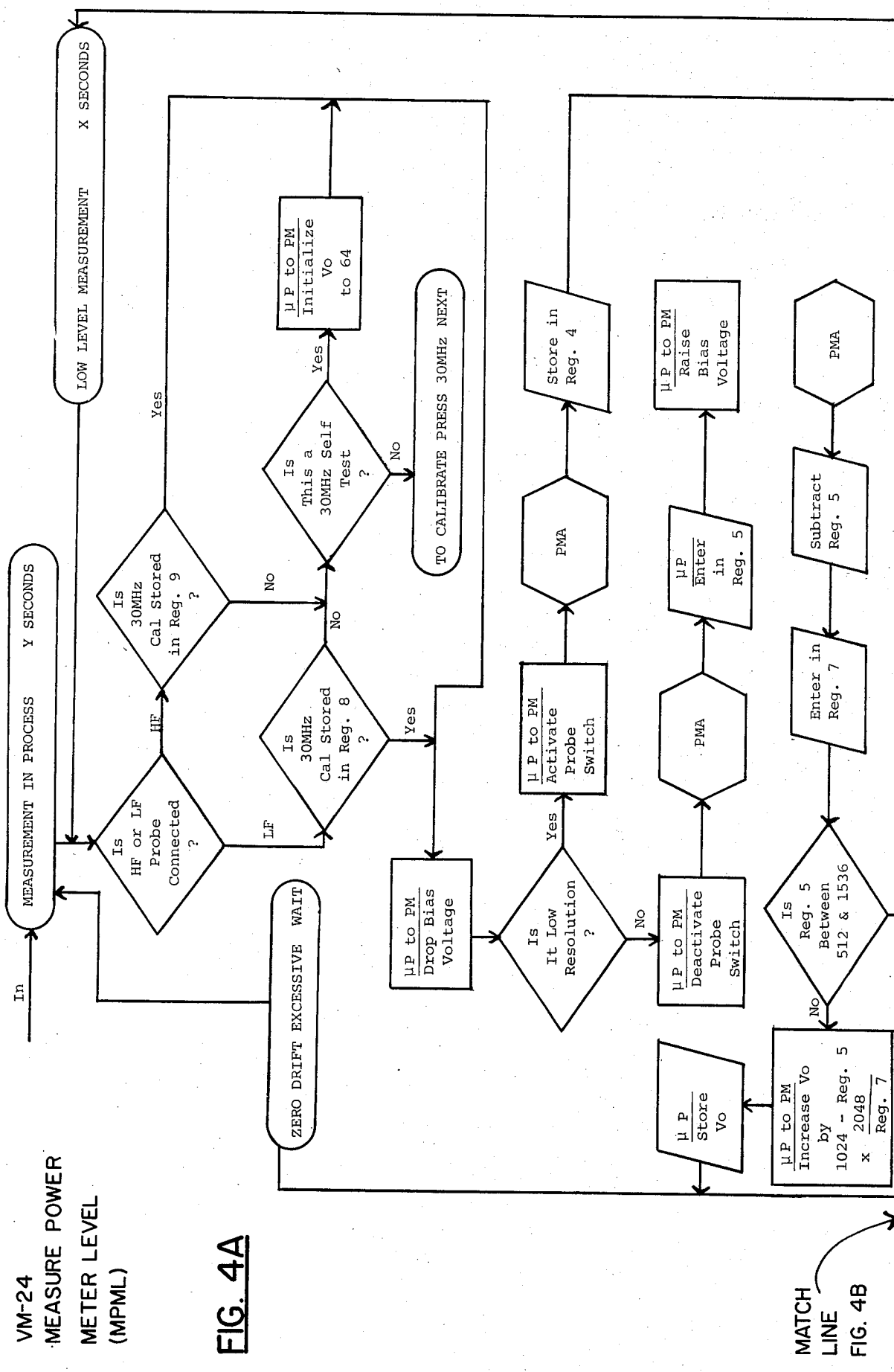
FIGS. 4A and 4B constitute a flow chart illustrating data processing operations performed by the invention.
Figure 4B:
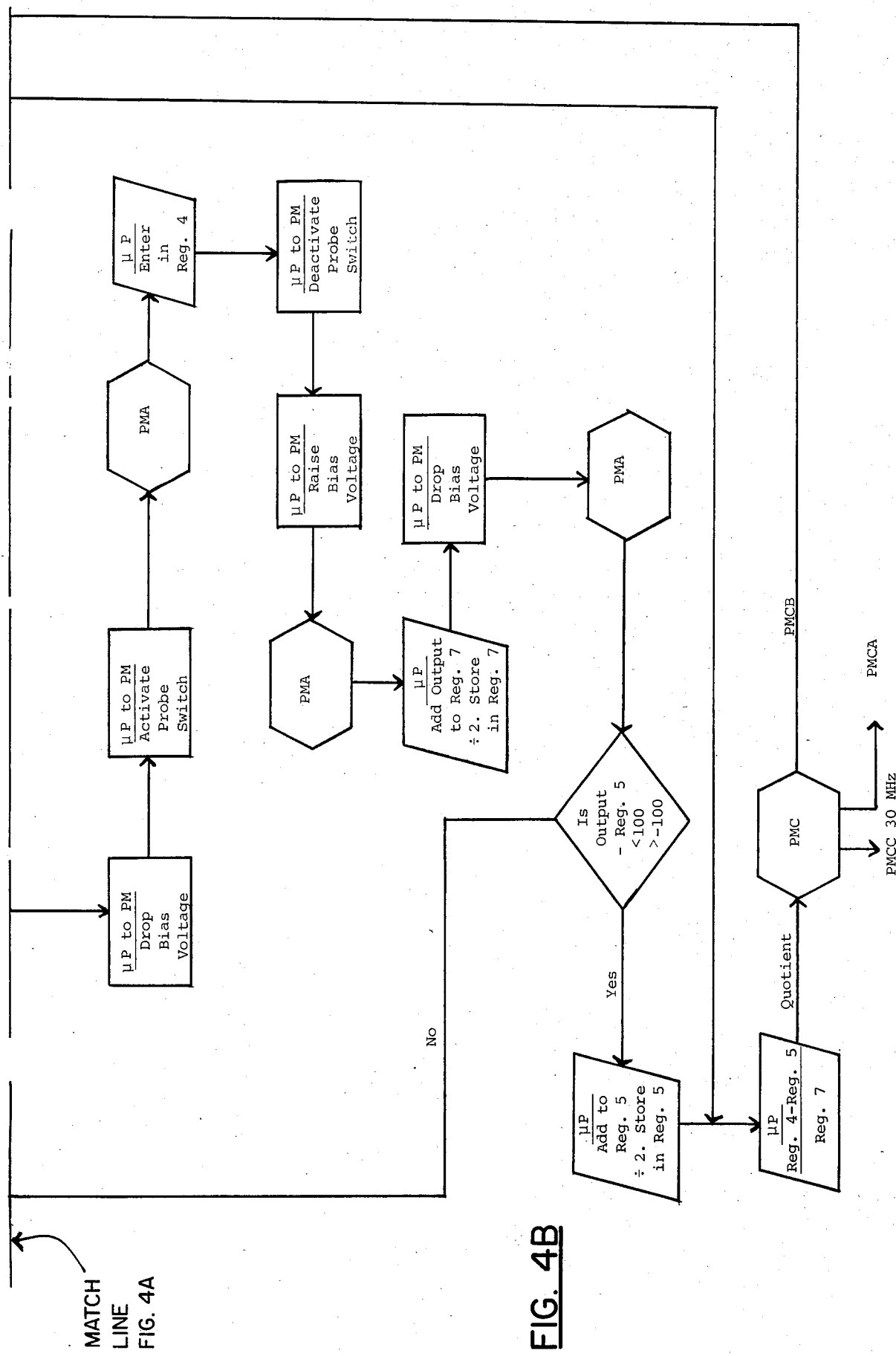

The power measurement adjustments are performed by the microprocessor 104 preferably according to the flowchart set forth in FIGS. 4A and 4B. Specifically, the microprocessor 104 first notes whether the RF power measured is at a high frequency (HF) or low frequency (LF) and performs related steps. Thereafter, the microprocessor 104 "drops the bias voltage" or, more specifically, assures that a fixed d.c. increment is removed. A low-high resolution decision is then made (a) the low resolution measurement being performed without concern for zeroing and calibration changes and (b) the high resolution measurement being performed with adjustments that account for zeroing and calibration changes.

In low resolution, RF is simply entered, measured, and stored digitially.

For high resolution, the microprocessor 104 effectuates a switch off of RF power (i.e. "deactivate probe switch") at control 102. With no RF power in, a first measurement is made and stored. This measurement represents zero measurement #1. The fixed d.c. increment is then fed from the D-to-A converter (of FIG. 1) to the input to the chopper stage 110. A second measurement is made in digital form and represents calibration signal #1. The first measurement (with no RF and no d.c. increment) is subtracted from the second measurement (with the increment applied). The microprocessor 104 determines if the difference is within desired limits which, for example, may correspond to 1.25 volts and 3.78 volts. If not, the zero adjustment level is varied according to the digital expression shown. This change in the zero level is reflected in a voltage $V_o$ which is applied to the input to the chopper stage 110 to compensate for large-scale drift. If the difference is within the limits, the fixed increment is dropped and the RF is permitted to enter the meter 103. A third measurement is then made and stored digitially.

The RF power is then discontinued and the fixed increment is again applied to generate calibration signal #2. The difference of the first from the second measurement is added to the calibration signal #2, the sum thereof being divided by 2 and is stored.

The fixed increment is again removed and another measurement, which represents zero measurement #2, is made. The zero measurement #2 is compared with zero measurement #1 to determine of the difference is within desired limits. If not, an "excessive zero drift" is noted. If within the limits, zero measurement #2 is added to the value of zero measurement #1 the sum being divided by 2 and is stored. (The above operations are, of course, performed digitally).

A quotient operation is then performed.

Reviewing the measurement made, it is noted that one zero measurement (z1) and one calibration measurement (c1) is made before the RF measurement is made and one zero measurement (z2) and one calibration measurement (c2) is made after the RF measurement is made. By using the two zero measurements and the two calibration measurements, the zero drift and the calibration drift at the time the RF measurement is made can be determined.

Referring to FIG. 5, the two zero measurements, (shown as z1 and z2) have an interpolated zero drift line therebetween. The two calibration measurements c1 and c2 have an interpolated drift line therebetween. An "x" on each drift line corresponds to the interpolated drifts for the particular Rf power measured at the time $t_m$.

The quotient, it is noted, is a function defined as:

$$\text{QUOTIENT} = \frac{\text{RF measured} - (z1 + z2)/2}{\frac{(c1 + c2) - (z1 + z2)}{2}} \quad [1]$$

The various measurements made are thus incorporated into the quotient.

The true RF, it is also noted, is related to the quotient by a factor K so that:

$$RF_{TRUE} = \text{QUOTIENT}/K. \quad [2]$$

The $RF_{TRUE}$ relationship suggests that if $RF_{TRUE}$ and the QUOTIENT are known, the factor K can be determined. With both the factor K and the QUOTIENT known, $RF_{TRUE}$ for an unknown RF input can be determined.

Accordingly, the flowchart of FIGS. 4A and 4B therefore teaches the determining of the adjustment factor K when a known RF input, such as 1mw, is applied and also teaches the using of the determined factor K in finding the true value of an unknown RF input—adjusted for zero drift and calibration drift.

In addition, the microprocessor 104 may, as desired, generate a profile of quotients and factors for different magnitudes of the fixed d.c. increment which is selectively applied and for different RF inputs. Adjustments to power meter measurements can thereby reflect different RF amplitude ranges.

Further, if desired, the present invention contemplates the deriving of a d.c. signal which, when applied to the chopper stage 110 (of FIG. 1), provides the same digitized output as does a known RF input applied to the thermocouple pair 102. The derived d.c. signal may substitute for the $RF_{TRUE}$ signal in the above expression [2] to generate the K value at successive times. The derived d.c. signal is determined from a stored digital signal which is converted to analog form. The derived d.c. signal is accurate on the order of 1 part in $10^6$ whereas the RF input is only accurate on the order of 1 part in $10^2$. Using the derived d.c. signal as a substitute d.c. signal provides a particularly accurate way of evaluating changes in the power meter 103 (after the thermocouple pair 106).

The microprocessor 104 may be any of various commercially available elements. Other components included in the invention are also known.

Other improvements, modifications, and embodiments will become apparent to one of ordinary skill in the art upon review of this disclosure. Such improvements, modifications and embodiments are considered to be within the scope of this invention as defined by the following claims.

I claim:

1. A meter for measuring an RF power, the meter comprising:
   thermocouple means for converting RF power into a d.c. signal which varies with the RF power level;
   means for establishing a sinusoidal signal having an offset from a reference level;
   chopper means for receiving and chopping the d.c. signal; and
   means for driving the chopper means with said offset sinusoidal input, the chopper means driven with said offset sinusoidal input providing an output signal that includes a series of sinusoidally-shaped, single-polarity pulses, the pulses varying in amplitude with the d.c. signal received by the chopper means; and
   means for producing from said chopper means output signal, a signal at a predetermined harmonic frequency of said sinusoidal input, wherein the predetermined harmonic signal varies in amplitude with the amplitude of the chopper means output signal.

2. A meter as in claim 1 wherein the harmonic producing means comprises:
   bias means for defining the ratio of (a) the spacing between successive sinusoidally-shaped pulses and (b) the pulse duration of said sinusoidally-shaped pulses; and
   a band-pass filter tuned to said harmonic frequency;
   the ratio of pulse spacing to pulse duration being defined by the bias means to correspond to the harmonic at which the band-pass filter is tuned;
   the input to the band-pass filter having (a) the same pulse spacing to pulse duration ratio as the chopper means output and (b) variations in amplitude corresponding to the amplitude variations of the chopper means output.

3. A meter as in claim 2 further comprising:
   amplifier means for increasing the amplitude of the output signal from the chopper means, the amplifier means being interposed between the output of the chopper means and the input to the band-pass filter.

4. A meter as in claim 3 wherein the ratio of pulse spacing to pulse duration is substantially equal to three, the band-pass filter thereby passing signals at only the second harmonic of the sinusoidal input that drives the chopper means.

5. A meter as in claim 3 further comprising:
   signal source means for providing a sinusoidal wave output, said sinusoidal input that drives the chopper means being derived from the sinusoidal wave output from the signal source means.

6. A meter as in claim 5 wherein the chopper means comprises a series chopper and a shunt chopper which operate in complementary states and wherein the d.c. signal produced by the thermocouple means is conveyed toward the band-pass filter only when the series chopper is conducting; and wherein the power measuring meter further comprises a clamp that offsets the amplitude of the signal source means wave output enroute to the series chopper and shunt chopper.

7. A meter as in claim 5 wherein the signal source means comprises an oscillator that generates a signal at a basic frequency, said signal at the basic frequency comprising said sinusoidal wave output, and wherein the sinusoidal input to the chopper means is at said basic frequency.

8. A meter as in claim 5 further comprising:

means for transforming the sinusoidal wave output from the source means into a tri-level square-wave signal which periodically switches upward to a high level and downward to a low level, in alternation, from a reference level;

the square-wave signal having a frequency equal to the frequency of the harmonic which passes through the bandpass filter.

9. A meter as in claim 7 further comprising:

means for transforming the sinusoidal wave output from the source means into a tri-level square-wave signal which periodically switches upward to a high level and downward to a low level, in alternation, from a reference level;

the square-wave signal having a frequency equal to the frequency of the harmonic which passes through the bandpass filter.

10. A meter as in claim 8 further comprising:

a synchronous detection circuit (a) having the square-wave signal output from the transforming means and the signal filtered through the band-pass filter as inputs and (b) having as output the product of the tri-level square-wave signal and the signal filtered through the bandpass filter;

the tri-level square-wave signal input being substantially centered in phase relative to the band-pass filter output when the tri-level square-wave signal input and the band-pass filter output are in-phase;

the variations in the amplitude of the product being small when the tri-level square-wave signal input is not centered, as when the tri-level square-wave signal input and the band-pass filter output slightly are out-of-phase.

11. A meter as in claim 9 further comprising:

a synchronous detection circuit (a) having the square-wave signal output from the transforming means and the signal filtered through the band-pass filter as inputs and (b) having as output the product of the tri-level square-wave signal and the signal filtered through the band-pass filter;

the tri-level square-wave signal input being substantially centered in phase relative to the band-pass filter output when the tri-level square-wave signal input and the band-pass filter output are in-phase;

the variations in the amplitude of the product being small when the tri-level square-wave signal input is not centered, as when the tri-level square-wave signal input and the band-pass filter output are slightly out-of-phase.

12. A meter as in claim 1 wherein the frequency of the sinusoidal input is at least 300 Hz.

13. A meter as in claim 11 wherein the frequency of the sinusoidal input is at least 300 Hz.

14. A meter as in claim 10 further comprising:

means for forming the product output from the synchronous detection circuit at each given time into a digital power measurement; and correction means for adjusting the digital power measurement into a true power measurement which accounts for zero drift and calibration of the power meter.

15. A meter as in claim 13 further comprising:

means for forming the product output from the synchronous detection circuit at each given time into a digital power measurement; and correction means for adjusting the digital power measurement into a true power which accounts for zero drift and calibration of the power meter.

16. A meter as in claim 14 wherein the correction means comprises:

means for selectively applying to the chopper means input either (a) a d.c. input generated in response to the application of an RF input to the thermocouple means, (b) a predefined d.c. increment, or (c) neither the generated d.c. input nor the predefined d.c. increment;

the digital power measurement formed when the generated d.c. is applied representing an RF power measurement;

the digital power measurement formed when the predefined d.c. is applied representing a calibration signal; and the digital power measurement formed when neither the generated d.c. input nor the predefined d.c. is applied representing a zero level measurement.

17. A meter as in claim 15 wherein the correction means comprises:

means for selectively applying to the chopper means input either (a) a d.c. input generated in response to the application of an RF input to the thermocouple means, (b) a predefined d.c. increment, or (c) neither the generated d.c. input nor the predefined d.c. increment;

the digital power measurement formed when the generated d.c. is applied representing an RF power measurement;

the digital power measurement formed when the predefined d.c. is applied representing a calibration signal; and the digital power measurement formed when neither the generated d.c. input nor the predefined d.c. is applied representing a zero level measurement.

18. A meter as in claim 16 wherein the correction means further comprises:

means for making an RF power measurement (P);

means for making (a) one zero measurement (Z1) before and one zero measurement (Z2) after the RF power measurement and (b) one calbration measurement (C1) before and one calibration measurement (C2) after the RF power measurement; and means for deriving a true RF indication for an RF power measurement, where the true RF indication ($RF_{TRUE}$) accounts for zero drift and calibration.

19. A meter as in claim 17 wherein the correction means further comprises:

means for making an RF power measurement (P);

means for making (a) one zero measurement (Z1) before and one zero measurement (Z2) after the RF power measurement and (b) one calbration measurement (C1) before and one calibration measurement (C2) after the RF power measurement; and means for deriving a true RF indication for an RF power measurement, where the true RF indication ($RF_{TRUE}$) accounts for zero drift and calibration.

20. A meter as in claim 18 wherein the $RF_{TRUE}$ deriving means comprises:
means for defining an expression that is a function of P, Z1, Z2, C1, and C2, and expression reflecting variations in zero drift and calibration relating to a given RF power measurement;
wherein the value of $RF_{TRUE}$ is equal to said expression divided by a factor K.

21. A meter as in claim 19 wherein the $RF_{TRUE}$ deriving means comprises:
means for defining an expression that is a function of P, Z1, Z2, C1, and C2, said expression reflecting variations in zero drift and calibration relating to a given power measurement;
wherein the value of $RF_{TRUE}$ is equal to said expression divided by a factor K.

22. A meter as in claim 20 wherein said expression represents a quotient defined as:

$$\text{QUOTIENT} = \frac{P - \frac{(Z1 + Z2)}{(2)}}{\frac{(C1 + C2) - (Z1 + Z2)}{(2)}}$$

23. A meter as in claim 22 wherein said correction means further comprises:
means for supplying a known value of RF input to the thermocouple means;
the RF power measurement made corresponding to the known RF input representing $RF_{KNOWN}$;
the value of K for a given d.c. increment being determined by the equation:

$$\frac{1}{K} = \frac{RF_{KNOWN}}{\text{QUOTIENT}_K}$$

where the values of $RF_{KNOWN}$ and $\text{QUOTIENT}_K$ are known, $\text{QUOTIENT}_K$ being the QUOTIENT when P corresponds to the known RF input.

24. A meter as in claim 23 wherein the correction means further comprises:
means for determining the value of $RF_{TRUE}$ for a formed RF power measurement made when an unknown RF input is applied to the thermocouple means;
the value of the QUOTIENT for said unknown RF input being represented by QUOTIENT'; and
the value of $RF_{TRUE}$ for said unknown RF input being represented by $RF_{TRUE}'$ which is defined as:

$$RF_{TRUE}' = \text{QUOTIENT}' \cdot \frac{1}{K} = \text{QUOTIENT}' \cdot \frac{RF_{KNOWN}}{\text{QUOTIENT}_K}$$

25. A meter as in claim 23 further comprising:
means for selecting one of a plurality of d.c. increments, each selected increment providing a different value of K.

26. A meter as in claim 24 further comprising:
means for selecting one of a plurality of d.c. increments, each selected increment providing a different value of K.

27. A meter for measuring an RF power according to claim 1 wherein said means for establishing includes means responsive to a digital signal to set and hold said d.c. offset.

28. A meter for measuring an RF power according to claim 27 further comprising:
means for calibrating said meter including means for changing saids d.c. offset.

29. A meter for measuring an RF power according to claim 27 wherein said means responsive to a digital signal is a digital to analog converted.

30. A meter for measuring an RF power, the meter comprising:
thermocouple means for converting RF power into a d.c. signal which varies with the RF power level;
means for producing an offset periodic signal;
chopper means for receiving and chopping the d.c. signal;
means for driving the chopper means with a succession of periodic pulses derived by said offset periodic signal; and
means for producing from said chopper means output a signal at a predetermined harmonic frequency of said periodic pulses, wherein the predetermined harmonic signal varies in amplitude with the amplitude of the chopper means output.

* * * * *